(12) United States Patent
Jung

(10) Patent No.: US 7,750,667 B2
(45) Date of Patent: Jul. 6, 2010

(54) SEMICONDUCTOR INTEGRATED CIRCUIT

(75) Inventor: Jin-Kook Jung, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/668,580

(22) Filed: Jan. 30, 2007

(65) Prior Publication Data

US 2008/0018361 A1 Jan. 24, 2008

(30) Foreign Application Priority Data

Jul. 20, 2006 (KR) .................... 10-2006-0067937

(51) Int. Cl.
*H03K 17/16* (2006.01)
*H03K 19/003* (2006.01)

(52) U.S. Cl. .................... 326/31; 365/225.7; 326/98; 327/546

(58) Field of Classification Search ............. 326/95–98, 326/93, 31, 33–34; 327/544–547, 530; 365/225.7, 365/200

See application file for complete search history.

(56) References Cited

U.S. PATENT DOCUMENTS

| | | | | |
|---|---|---|---|---|
| 5,058,059 A | * | 10/1991 | Matsuo et al. ............... 365/96 |
| 5,337,278 A | * | 8/1994 | Cho ............................ 365/200 |
| 5,418,406 A | * | 5/1995 | Hirano et al. ............... 327/172 |
| 5,422,850 A | * | 6/1995 | Sukegawa et al. ........... 365/200 |
| 5,689,465 A | * | 11/1997 | Sukegawa et al. ........... 365/200 |
| 5,712,588 A | * | 1/1998 | Choi et al. ................... 327/525 |
| 5,764,652 A | * | 6/1998 | Chun ........................... 714/711 |
| 5,862,087 A | * | 1/1999 | Lee .............................. 365/200 |
| 5,907,513 A | * | 5/1999 | Kato ............................ 365/200 |
| 6,026,037 A | * | 2/2000 | Hong ........................... 365/200 |
| 6,236,241 B1 | * | 5/2001 | Liu et al. ..................... 326/121 |
| 6,392,937 B2 | * | 5/2002 | Nagai .......................... 365/200 |
| 6,506,634 B1 | * | 1/2003 | Kohyama .................... 438/132 |
| 6,765,414 B2 | * | 7/2004 | Keshavarzi et al. ........... 326/93 |
| 7,248,529 B2 | * | 7/2007 | Kamiya et al. ........... 365/225.7 |
| 2001/0023093 A1 | * | 9/2001 | Do et al. ..................... 438/200 |
| 2005/0041492 A1 | * | 2/2005 | Kim ............................. 365/200 |
| 2007/0247196 A1 | * | 10/2007 | Niedermeier et al. ......... 326/95 |

* cited by examiner

*Primary Examiner*—James H. Cho
*Assistant Examiner*—Jason Crawford
(74) *Attorney, Agent, or Firm*—F. Chau & Associates, LLC

(57) ABSTRACT

A semiconductor integrated circuit includes a MOS logic operating by first and second voltages; a switching transistor unit disposed between a supply terminal of the first voltage or the second voltage and the MOS logic, and turned on or off in response to a control signal so as to control a supply of the first or second voltage to the MOS logic; and a fuse unit disposed between the supply terminal of the first voltage or the second voltage and the switching transistor unit, for cutting off a supply of the first or second voltage to the switching transistor unit by a selective cut based on a test result. Whereby, a product development or production difficulty or a yield decrease based on a performance drop or leakage current increase in a circuit having a power gate or MTCMOS may be improved. In addition, a product development delay caused by a mask revision required at a transistor level may be improved in a revision of an NMOS or PMOS transistor.

5 Claims, 8 Drawing Sheets

SEMICONDUCTOR INTEGRATED CIRCUIT

CROSS REFERENCE TO RELATED APPLICATION

This application claims priority under 35 U.S.C. §119 from Korean Patent Application 10-2006-0067937, filed on Jul. 20, 2006, the contents of which are hereby incorporated by reference in their entirety herein.

BACKGROUND OF THE INVENTION

1. Technical Field

The present disclosure relates to semiconductor circuits, and more particularly, to a semiconductor integrated circuit including a power gate or a multi-threshold CMOS device (MTCMOS) and a method of fabricating the same, in order to reduce a leakage current in a stop mode.

2. Discussion of Related Art

At present, performance of VLSI (Very Large Scale Integration) circuits and a combination capability of realizing respective circuits in one chip have been undergoing remarkable development. In particular, the increased number of image systems and radio communication equipment and the like requires circuits capable of performing various complicated functions. In order to perform such various complicated functions in the circuit, relatively more transistors should be combined. But excessive power consumption in the circuit limits the number of transistors that can be combined. The excessive power consumption increases a generation of heat in the circuit, and the heat degrades the performance of the circuit, as well as the system employing the circuit.

Further, excessive power consumption may shorten a change period of secondary batteries in portable instruments that use the secondary batteries as the main power supply source. Thus, lessening a power consumption is a necessarily required object in designing semiconductor integrated circuits.

In general, the main causes of power consumption in a MOS circuit may be based on a switching power and a short-circuit current, as well as being based on a leakage current and the like. More specifically, the power consumption based on the leakage current occurs by a leakage current generated in a stop mode. The stop mode herein may also indicate a standby state in which the MOS circuit does not operate.

FIG. 1 is a current diagram illustrating a conventional art circuit to reduce a leakage current generated in a stop mode.

FIG. 1 illustrates a structure of power gate including a MOS logic 10 and a switching transistor PM1.

The MOS logic 10 is connected with a power terminal and a ground terminal, and operates by receiving a power source voltage VDD when the switching transistor PM1 is turned on. The MOS logic 10 has a relatively low threshold voltage as compared with the switching transistor PM1. The MOS logic 10 may be a circuit constructed of, for example, a number of MOS transistors, such as a CMOS inverter.

The switching transistor PM1 is a PMOS transistor. Thus, when a switching signal S1 has a low level, the switching transistor PM1 is turned on, and when the switching signal S1 has a high level, the switching transistor PM1 is turned off.

The switching transistor PM1 may be realized by a level under M1 or M2 from among a plurality of metal layers of, for example, M0, M1, M2, M3 . . . from a lower part of an upper part of a vertical structure of the transistor. That is, the switching transistor PM1 may be designed so as not to influence the metal layers next to layers M1 or M2.

The number of switching transistors PM1 required for a semiconductor integrated circuit of FIG. 1 may be determined by the highest power of the MOS logic 10. For example, in assuming a driving current of one switching transistor PM1 is 1 μÅ, a leakage current is 1nÅ, and an anticipated greatest power of the MOS logic is 100 mW@1.0V/400 Mhz; the required number of switching transistors is 100,000.

Further, leakage current in the stop mode is 1nÅ*100,000, that is, 100 μÅ. In such systematic design, when the highest power required for the semiconductor integrated circuit is 200 mW, the required number of switching transistors is 200,000, in other words, 100,000 more than the number when 100 mW is the highest power. In order to meet such requirement it is difficult to find an appropriate method except a revision of the circuit design.

If the revision is not performed, the semiconductor integrated circuit may face a performance drop or leakage current increase.

That is, in case a pre-computed or simulated leakage current value actually has an error in a semiconductor integrated circuit on a wafer, the revision should be performed, or a product development or production impossibility due to a performance drop or leakage current increase should be accepted without any other solution, further bringing about a yield decrease or performance drop.

Even though the revision is performed, a mask revision is needed from a transistor level, so that the product development may be delayed.

FIG. 2 is a circuit diagram illustrating another example of a conventional art circuit to reduce a leakage current generated in a stop mode.

FIG. 2 illustrates a structure of MTCMOS (Multi Threshold CMOS (Complementary Metal Oxide Semiconductor)) having a MOS logic 20 and a switching transistor NM1.

The MTCMOS is a semiconductor integrated circuit having a structure to control a threshold voltage of the MOS logic 20, and the switching transistor NM1 is an NMOS transistor.

In an operating mode, the switching transistor NM1 is turned on by a switching signal S2 of high level, and in a stop mode the switching transistor NM1 is turned off by the switching signal S2 at a low level.

Similar problems may occur in the MTCMOS structure of FIG. 2 just as in in the power gate structure shown in FIG. 1, such as a dependency upon a circuit revision, or a product development or production impossibility based on a performance drop or leakage current increase, or a yield decrease or performance drop.

FIG. 3 is a circuit diagram illustrating another example of a conventional art circuit to reduce leakage current generated in a stop mod.

A MOS logic 30 may include transistors having a low threshold voltage. A switching transistor PM3 having a high threshold voltage may be positioned between the power source voltage VDD and the MOS logic 30, and a switching transistor NM3 having a high threshold voltage is positioned between the MOS logic 30 and a ground voltage VSS.

The switching transistor PM3 may be a PMOS transistor and the switching transistor NM3 may be an NMOS transistor.

When the MOS logic 30 operates, the switching transistors PM3, NM3 having a high threshold voltage are turned on, supplying power to the MOS logic 30. While the MOS logic 30 is in the stop mode, the switching transistor PM3 controlled by a switching signal S3 is turned off through a high threshold voltage of the switching transistor PM3, and the switching transistor NM3 controlled by a switching signal S5 is also turned off, thus reducing a leakage current of the circuit.

The MOS logic 30 connected between a virtual power node N3 and a virtual ground node N4 has a low threshold voltage.

In the operating mode of the circuit shown in FIG. 3, the switching signal S3 has a low level, and the switching signal S4 has a high level. Then, the switching transistor PM3 and the switching transistor NM3 are turned on, and the virtual power node N3 and the virtual ground node N4 operate by an actual power source voltage and a ground voltage, thereby reducing a resistance of the circuit.

When in the stop or standby mode, the switching signal S3 has a high level and the switching signal S4 has a low level, the switching transistor PM3 and the switching transistor NM3 having a high threshold voltage are both turned off. Thus, a leakage current may be reduced in the stop mode.

This approach, however, also has problems similar to those in the power gate structure and the MTCMOS structure shown in FIGS. 1 and 2. For example, such problems involve a dependency upon the circuit revision, or a product development or production impossibility based on a performance drop or leakage current increase, or a shield decrease. Also, a mask revision is required from a transistor level, thereby delaying a development schedule.

In the case of a semiconductor integrated circuit including a power gate or MTCMOS significantly influencing a performance or leakage current, a size, number and structure of an NMOS transistor or PMOS transistor involve some estimation error; and a solution therefore is necessarily required through a semiconductor integrated circuit including a power gate or MTCMOS structure to more easily perform a revision of the semiconductor integrated circuit and satisfactorily provide an operating environment of the circuit with consideration of a leakage current and performance of the stop mode.

SUMMARY OF THE INVENTION

Accordingly, exemplary embodiments of the present invention provide a semiconductor integrated circuit, and a method of fabricating the same, that is capable of improving error occurrence in estimation for a size, number and structure of an NMOS transistor or PMOS transistor in a semiconductor integrated circuit having a power gate or MTCMOS. Further, a product development or production impossibility based on a performance drop or leakage current increase or a yield decrease, in the semiconductor integrated circuit having a power gate or MTCMOS may be improved. Furthermore, in performing a revision when an error in the estimation for the size, number and structure etc. of NMOS transistor or PMOS transistor is generated, the difficulty of a product development being delayed by a mask revision that is required form a transistor level, may be improved.

Exemplary embodiments of the present invention provide a semiconductor integrated circuit including a power gate or MTCMOS structure capable of satisfactorily providing an operating environment of the semiconductor integrated circuit under a consideration for a leakage current and performance in a stop mode.

According to exemplary embodiments of the present invention, a semiconductor integrated circuit includes a MOS logic operating by first and second voltages; a switching transistor unit disposed between a supply terminal of the first voltage or the second voltage and the MOS logic, and turned on or off in response to a received control signal so as to control a supply of the first or second voltage to the MOS logic; and a fuse unit disposed between the supply terminal of the first voltage or the second voltage and the switching transistor unit, for cutting off a supply of the first or second voltage to the switching transistor unit by a selective cut based on a test result.

The first voltage may be a power source voltage, and the second voltage may be a ground voltage, and at least one switching transistor constituting the switching transistor unit may be a PMOS transistor.

The fuse unit may include at least one fuse for every switching transistor.

The fuse unit may be a portion of an uppermost metal layer of the semiconductor integrated circuit.

The first voltage may be a ground voltage, and the second voltage may be a power source voltage, and at least one switching transistor constituting the switching transistor unit may be an NMOS transistor.

According to exemplary embodiments of the present invention, a semiconductor integrated circuit includes a MOS logic operating by first and second voltages; a first switching transistor unit disposed between a supply terminal of the first voltage and the MOS logic, and turned off to disconnect an electrical connection between the supply terminal of the first voltage and the MOS logic; a second switching transistor unit disposed between a supply terminal of the second voltage and the MOS logic, and turned off to disconnect an electrical connection between the supply terminal of the second voltage and the MOS logic; a first fuse unit disposed between the supply terminal of the first voltage and the first switching transistor unit, for cutting off a supply of the first voltage to the first switching transistor unit by a selective cut based on a test result; and a second fuse unit disposed between the supply terminal of the second voltage and the second switching transistor unit, for cutting off a supply of the second voltage to the second switching transistor unit by a selective cut based on a test result.

The first voltage may be a power source voltage, and the second voltage may be a ground voltage.

At least one transistor of the first switching transistor unit may be a PMOS transistor.

At least one transistor of the second switching transistor unit may be an NMOS transistor.

The first and second fuse units may be portions of an uppermost metal layer of the semiconductor integrated circuit.

According to exemplary embodiments of the present invention, a method of fabricating a semiconductor integrated circuit includes forming an MOS logic; forming a switching transistor unit to control a supply of a first voltage required for operation of the MOS logic; and forming a fuse unit disposed between the switching transistor unit and a supply terminal of the first voltage on the switching transistor unit, the fuse unit acting to cut off a supply of the first voltage to the switching transistor unit by a selective cut based on a test result.

The first voltage may be a power source voltage or a ground voltage.

The fuse unit may be an electric fuse link fused by an overcurrent.

The fuse unit may be a portion of an uppermost metal layer of the semiconductor integrated circuit.

According to exemplary embodiments of the present invention, a method of fabricating a semiconductor integrated circuit includes forming an MOS logic; forming a switching transistor unit to control a supply of power source voltage or ground voltage required for operation of the MOS logic; forming a fuse unit disposed between the switching transistor unit and a supply terminal of the power source voltage or the ground voltage on the switching transistor unit; and cutting a fuse constituting the fuse unit according to a test result.

The cutting of the fuse may be a step of fabricating a mask of the fuse based on the test result and cutting the fuse by using the mask.

BRIEF DESCRIPTION OF THE DRAWINGS

Exemplary embodiments of the present invention will be understood in more detail from the following descriptions taken in conjunction with the attached drawings, wherein.

DETAILED DESCRIPTION OF THE EXEMPLARY EMBODIMENTS

Exemplary embodiments of the present invention now will be described more fully hereinafter with reference to the accompanying drawings. This invention may, however, be embodied in many different forms and should not be construed as limited to the exemplary embodiments set forth herein. Rather these exemplary embodiments are provided so that this disclosure will be thorough and complete, and will fully convey the scope of the invention to those skilled in the art. Exemplary embodiments of the present invention are more fully described below with reference to FIGS. 4 to 8. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art.

Figure 1:
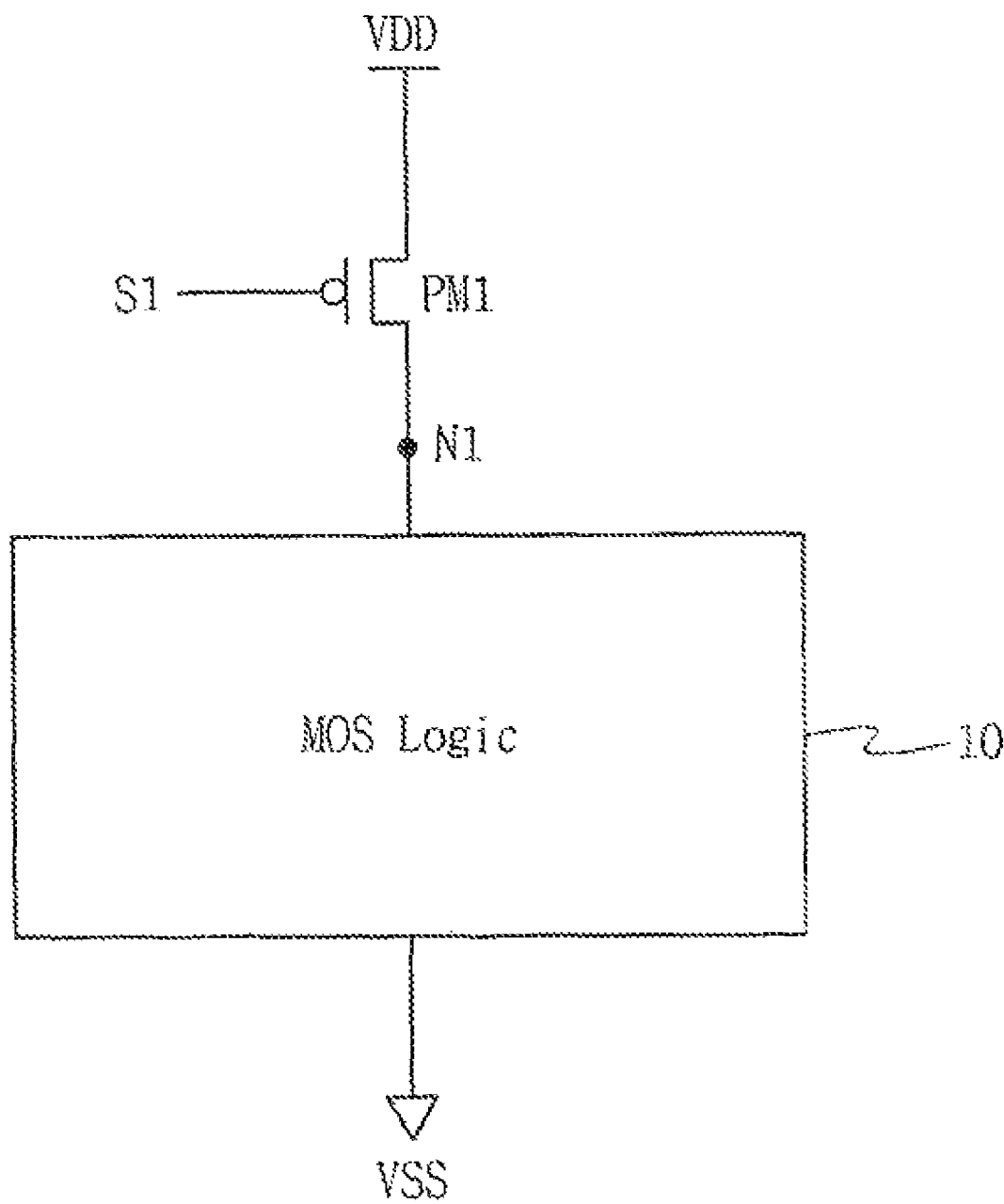
FIG. 1 is a circuit diagram illustrating an example of a conventional art circuit used to reduce a leakage current generated in a stop mode.
Figure 2:
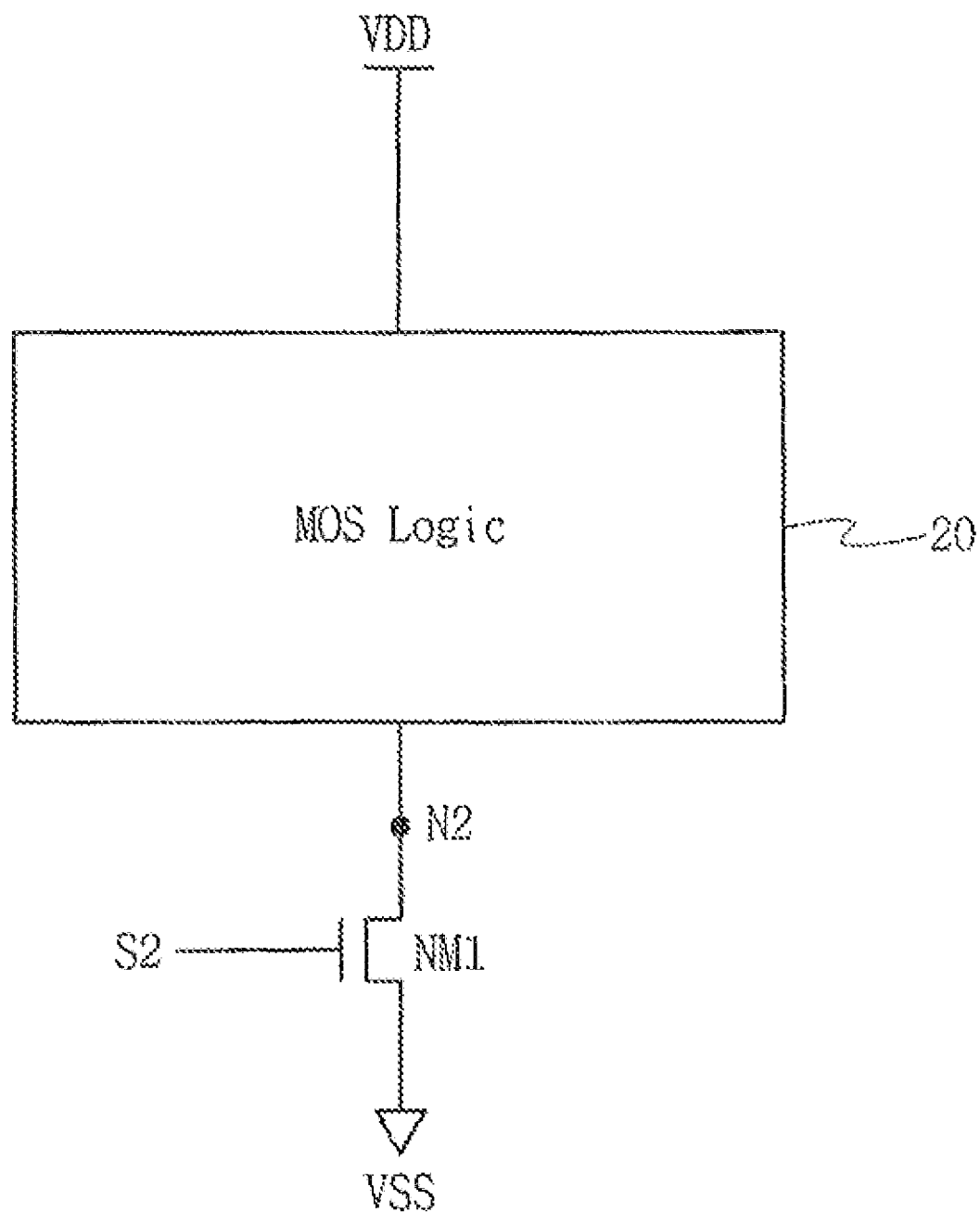
FIG. 2 is a circuit diagram illustrating another example of a conventional art circuit used to reduce a leakage current generated in a stop mode.
Figure 3:
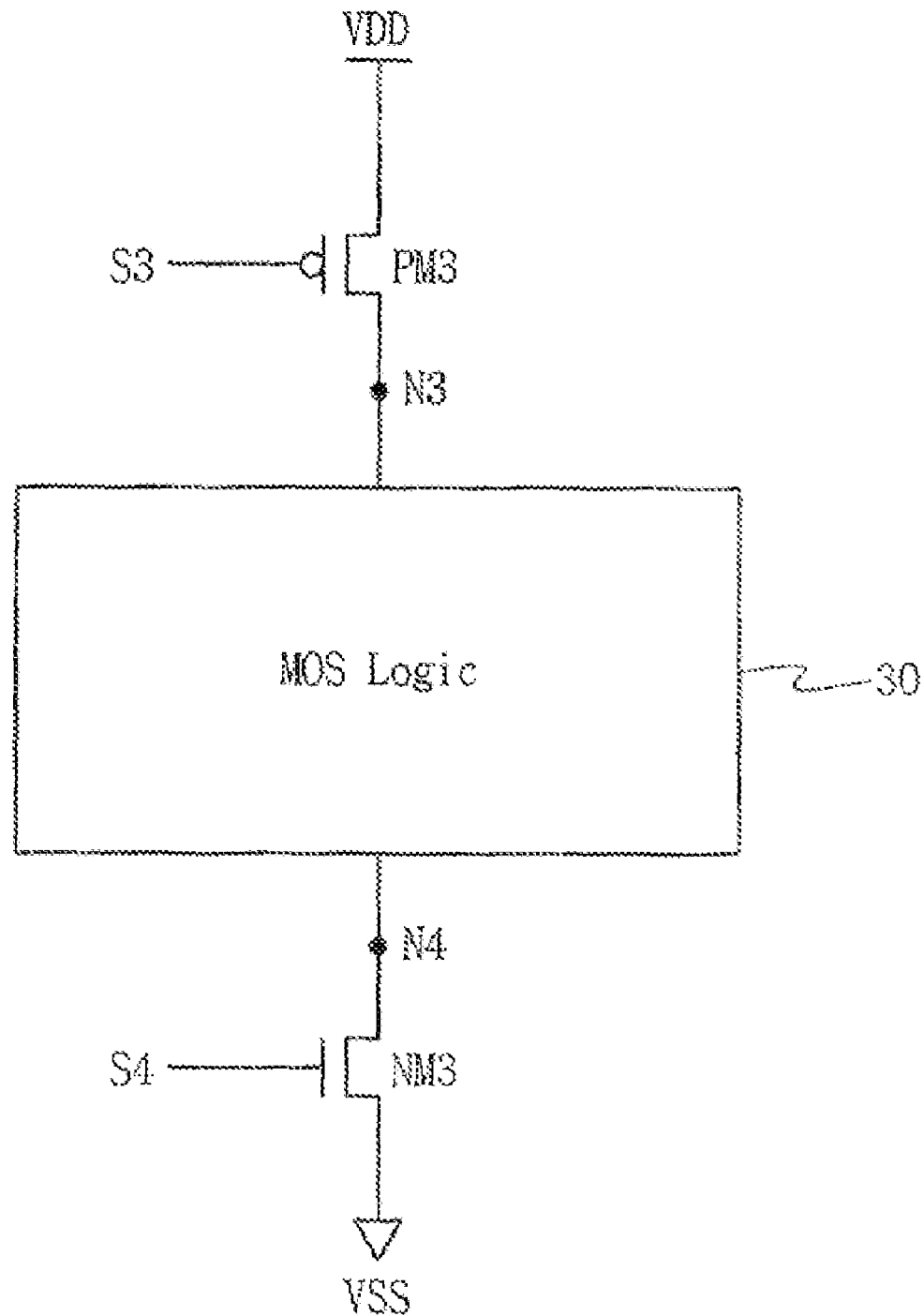
FIG. 3 is a circuit diagram illustrating other example of a conventional art circuit used to reduce a leakage current generated in a stop mode.
Figure 4:
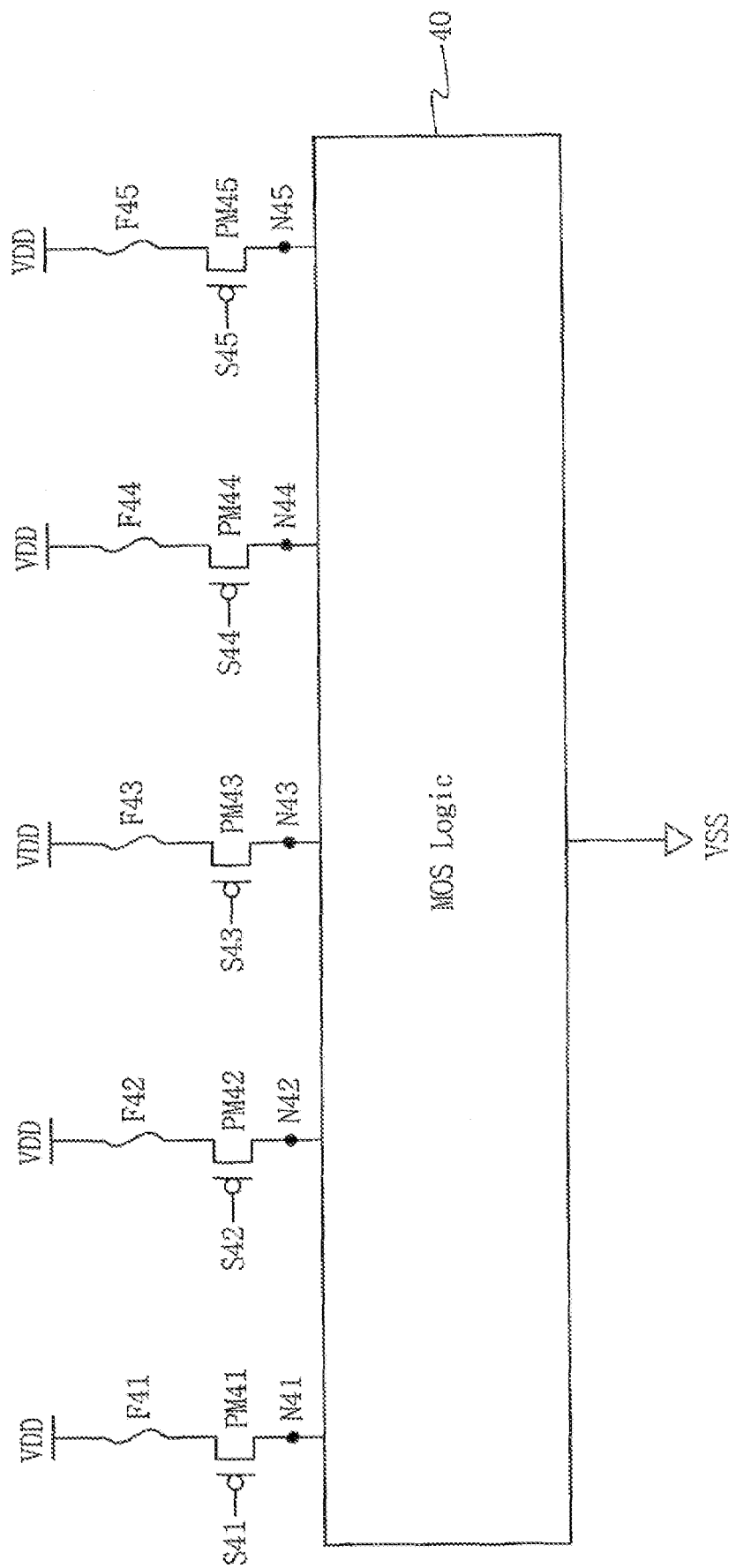
FIG. 4 is a circuit diagram illustrating an example of a semiconductor integrated circuit to perform a revision by considering a performance and a leakage current according to an exemplary embodiment of the present invention.

FIG. 4 is a circuit diagram illustrating an example of a semiconductor integrated circuit to appropriately perform a revision by considering performance and a leakage current according to an exemplary embodiment of the present invention.

Referring to FIG. 4, the semiconductor integrated circuit includes MOS logic 40, a switching transistor unit consisting of transistors PM41, PM42, PM43, PM44, PM45 and a fuse unit consisting of fuses F41, F42, F43, F44, F45.

The MOS logic 40 operates using first and second voltages. The first voltage may be a power source voltage VDD and the second voltage may be a ground voltage VSS. The MOS logic 40 may be a circuit constructed of, for example, a plurality of MOS transistors (not shown) such as a CMOS inverter.

The switching transistors PM41~PM45 are disposed between a supply terminal of the first voltage VDD and the MOS logic 40. In FIG. 4, the five switching transistors are shown just as an example and more or less could be employed. Each switching transistor PM41~PM45 is a PMOS transistor in this exemplary embodiment.

Switching transistors PM41~PM45 each receive a corresponding control signal from switching signals S41~S45, and so are turned on or off. Therefore, each switching transistor PM41~PM45 controls a supply of the power source voltage VDD to the MOS logic 40.

Thus, in the MOS logic 40 a virtual power node N41~N45 operates actually with the power source voltage in an operating mode and so a resistance of the circuit is reduced. On the other hand, in the MOS logic 40 the switching transistor PM41~PM45 having a high threshold voltage is turned off in a stop mode and so a leakage current may be reduced.

The fuse unit consisting of fuses F41~F45 is disposed between a supply terminal of the first voltage VDD and the switching transistors PM41~PM45, and cuts off a supply of the first voltage VDD to the switching transistor PM41~PM45 by a selective cut based on a test result. The fuse unit includes at least one fuse F41~F45 disposed corresponding to every switching transistor PM41~PM45. The fuses F41~F45 may be a portion of an uppermost metal layer of the semiconductor integrated circuit.

That is, the switching transistors PM41~PM45 may be realized through a level under M1 or M2 from among several metal layers, for example, as layers M0, M1, M2, M3 . . . Mn from a lower part to an upper part in a vertical structure of the metal layer, and the fuses F41~F45 may be formed as a portion of an uppermost metal layer Mn of the semiconductor integrated circuit.

Thus, the difficulty in mask revision from a transistor level and a delay in product development as in a conventional revision, may be improved upon by this exemplary embodiment. In other words, in the test result, when the cut number of fuses is decided upon based on a consideration of performance and leakage current, a portion of the fuse unit consisting of fuses F41~F45 is cut by using a laser or the like, thereby performing an appropriate revision.

On the other hand, if the fuse unit consisting of fuses F41~F45 is an electric fuse that can be fused by an overcurrent, the fuses F41~F45 may not be a portion of an uppermost metal layer of the semiconductor integrated circuit.

In the test, an estimated largest power of the MOS logic 40 and each current drive capability of the switching transistor PM41~PM45 are considered.

Figure 5:
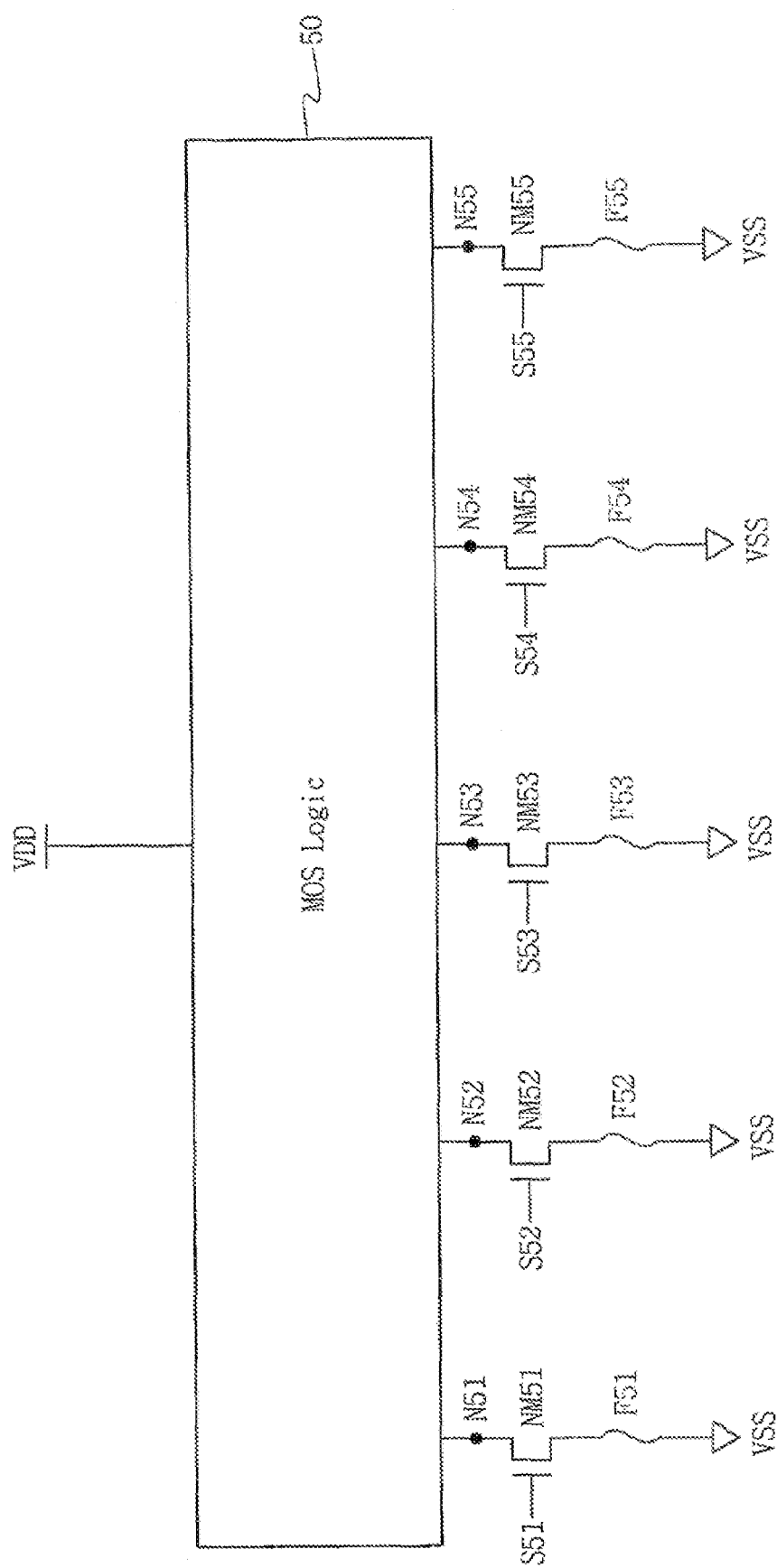
FIG. 5 is a circuit diagram illustrating an exemplary embodiment of a semiconductor integrated circuit to perform a revision with consideration of performance and a leakage current.

FIG. 5 is a circuit diagram illustrating an exemplary embodiment of a semiconductor integrated circuit intended to perform an appropriate integrated circuit revision taking into consideration performance and leakage current.

Referring to FIG. 5, the semiconductor integrated circuit includes MOS logic 50, a switching transistor unit consisting of transistors NM51, NM52, NM53, NM54, NM55 and a fuse unit consisting of fuses F51, F52, F53, F54, F55.

The MOS logic 50 operated by first and second voltages. The first voltage may be power source voltage VDD and the second voltage may be a ground voltage VSS. The MOS logic 50 may be a circuit constructed of, for example, a plurality of MOS transistors such as a CMOS inverter.

The switching transistor unit consisting of transistors NM51~NM55 is disposed between a supply terminal of the second voltage VSS and the MOS logic 50. In FIG. 5, the five switching transistors are shown just as an example and more or less could be employed as in FIG. 4. Each switching transistor NM51~NM55 is an NMOS transistor in this exemplary embodiment.

Switching transistors NM51~NM55 each receive a corresponding control signal, switching signal S51~S55, and so are turned on or off. Therefore, the switching transistor unit consisting of transistors NM51~NM55 controls a supply of the second voltage as ground voltage VSS to the MOS logic 50.

Thus, in the MOS logic 50 a virtual power node N51~N55 operates with an actual ground voltage in an opening mode and so a resistance of the circuit is reduced. Meanwhile, in the MOS logic 50 the switching transistors NM51~NM55 having a high threshold voltage are turned off in a stop mode and so a leakage current may be reduced.

The fuse unit consisting of fuses F51~F55 is disposed between a supply terminal of the second voltage VDD and the switching transistors NM51~NM55, and cuts off a supply of the second voltage VSS to the switching transistor NM51~NM55 by a selective cut based on a test result. The fuse unit includes at least one fuse F51~F55 disposed corresponding to every switching transistor NM51~NM55. The fuse unit consisting of fuses F51~F55 may be a portion of an uppermost metal layer of the semiconductor integrated circuit, as in the fuses F41~F45 shown in FIG. 4.

Thus, the difficulty in mask revision from a transistor level and delay in a product development as in a conventional revision like in FIG. 4, may be improved upon by this exemplary embodiment. In other words, in the test result, when the cut number of fuses is decided upon based on a consideration of performance and leakage current, a portion of the fuse unit consisting of fuses F51~F55 is cut by using laser or the like, thereby performing an appropriate revision.

Likewise, when the fuses F51~F55 is an electric fuse that can be fused by an overcurrent, the fuses F51~F55 may not be a portion of an uppermost metal layer of the semiconductor integrated circuit.

Figure 6:
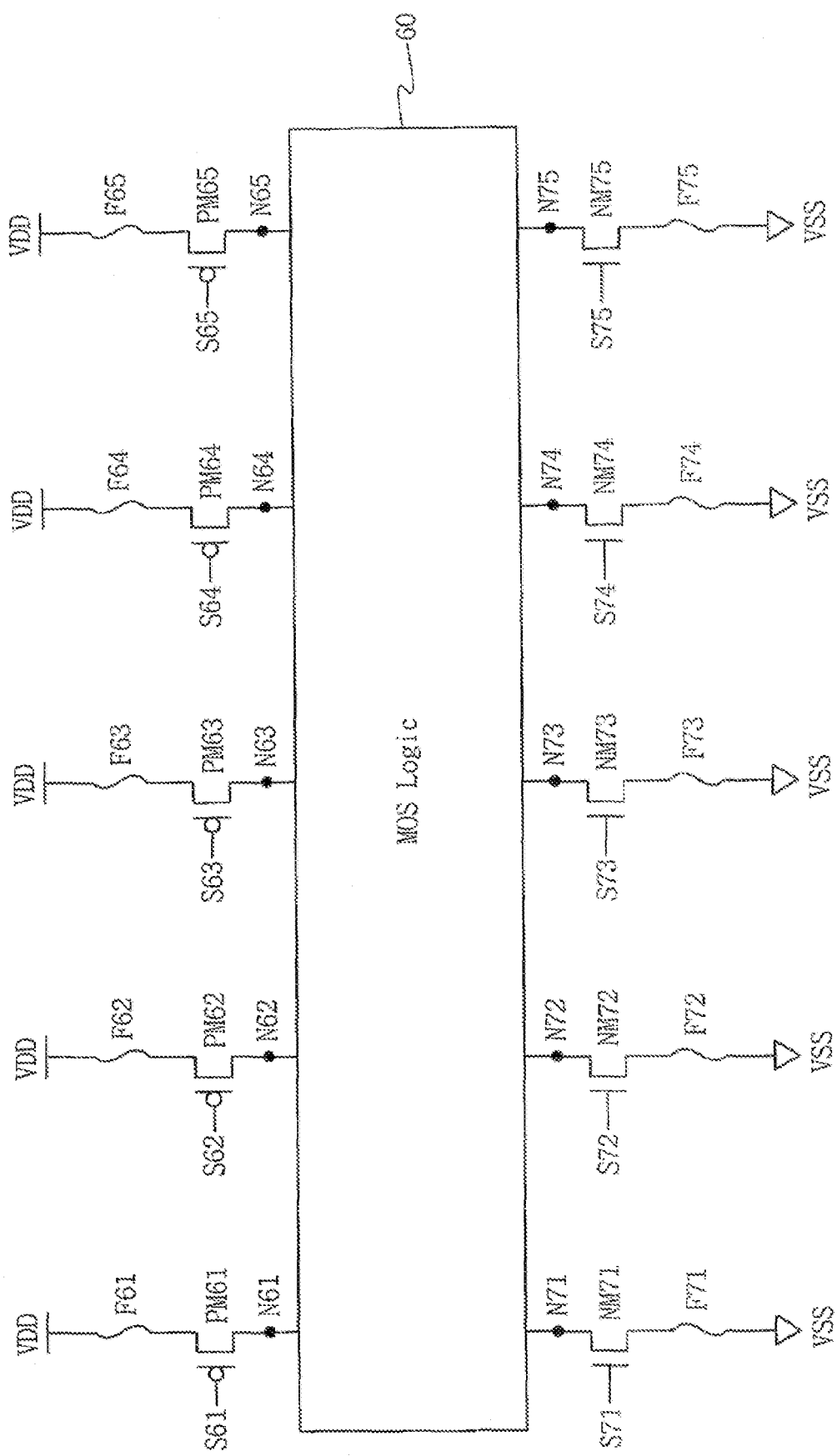
FIG. 6 is a circuit diagram illustrating a semiconductor integrated circuit to perform a revision with consideration of performance and a leakage current according to an exemplary embodiment of the present invention.

FIG. 6 is a circuit diagram illustrating a semiconductor integrated circuit intended to appropriately perform an integrated circuit revision taking into consideration performance and leakage current according to an exemplary embodiment of the present invention.

With reference to FIG. 6, the semiconductor integrated circuit includes MOS logic 60, a first switching transistor unit consisting of transistors PM61, PM62, PM63, PM64, PM65, a second switching transistor unit consisting of transistors NM71, NM72, NM73, NM74, NM75, a first fuse unit consisting of fuses F61, F62, F63, F64, F65, and a second fuse unit consisting of fuses F71, F72, F73, F74, F75.

The MOS logic 60 operates by first and second voltages. The first voltage may be the power source voltage VDD and the second voltage may be a ground voltage VSS. The MOS logic 60 may be a circuit constructed of, for example, a plurality of MOS transistors, such as a CMOS inverter.

The first switching transistor unit consisting of transistors PM61~PM65 is disposed between a supply terminal of the first voltage VDD and the MOS logic 60, and is turned off to disconnect an electrical connection between the supply terminal of the first voltage VDD and the MOS logic 60. At least one of the transistors PM61~PM65 is a PMOS transistor in this exemplary embodiment.

The second switching transistor unit consisting of transistors NM71~NM75 is disposed between a supply terminal of the second voltage VSS and the MOS logic 60, and is turned off to disconnect an electrical connection between the supply terminal of the second voltage VSS and the MOS logic 60. At least one of the transistors NM71~NM75 is an NMOS transistor in this exemplary embodiment.

The first fuse unit consisting of fuses F61~F65 is disposed between a supply terminal of the first voltage VDD and the first switching transistor unit consisting of transistors PM61~PM65, and cuts off a supply of the first voltage VDD to the first switching transistors PM61~PM65 by a selective cut based on a test result.

The second fuse unit consisting of fuses F71~F75 is disposed between a supply terminal of the second voltage VSS and the second switching transistor unit consisting of transistors NM71~NM75, and cuts off a supply of the second voltage VSS to the second switching transistors NM71~NM75 by a selective cut based on a test result.

The first fuse unit consisting of fuses F61~F65 and the second fuse unit consisting of fuses F71~F75 may be a portion of an uppermost metal layer of the semiconductor integrated circuit.

Thus, the difficulty in mask revision from a transistor level and a delay in product development as in a conventional revision like in FIG. 4 or 5, may be improved upon by this exemplary embodiment. In other words, in the test result, when the cut number of fuses is decided upon based on a consideration of performance and leakage current, a portion of the fuse unit consisting of fuses F41~F45 is cut by using a laser or the like, thereby performing an appropriate revision.

Likewise, when the fuse unit consisting of fuses F61~F65 is an electric fuse fused by an overcurrent, the fuses F61~F65 may not be a portion of an uppermost metal layer of the semiconductor integrated circuit.

Figure 7:
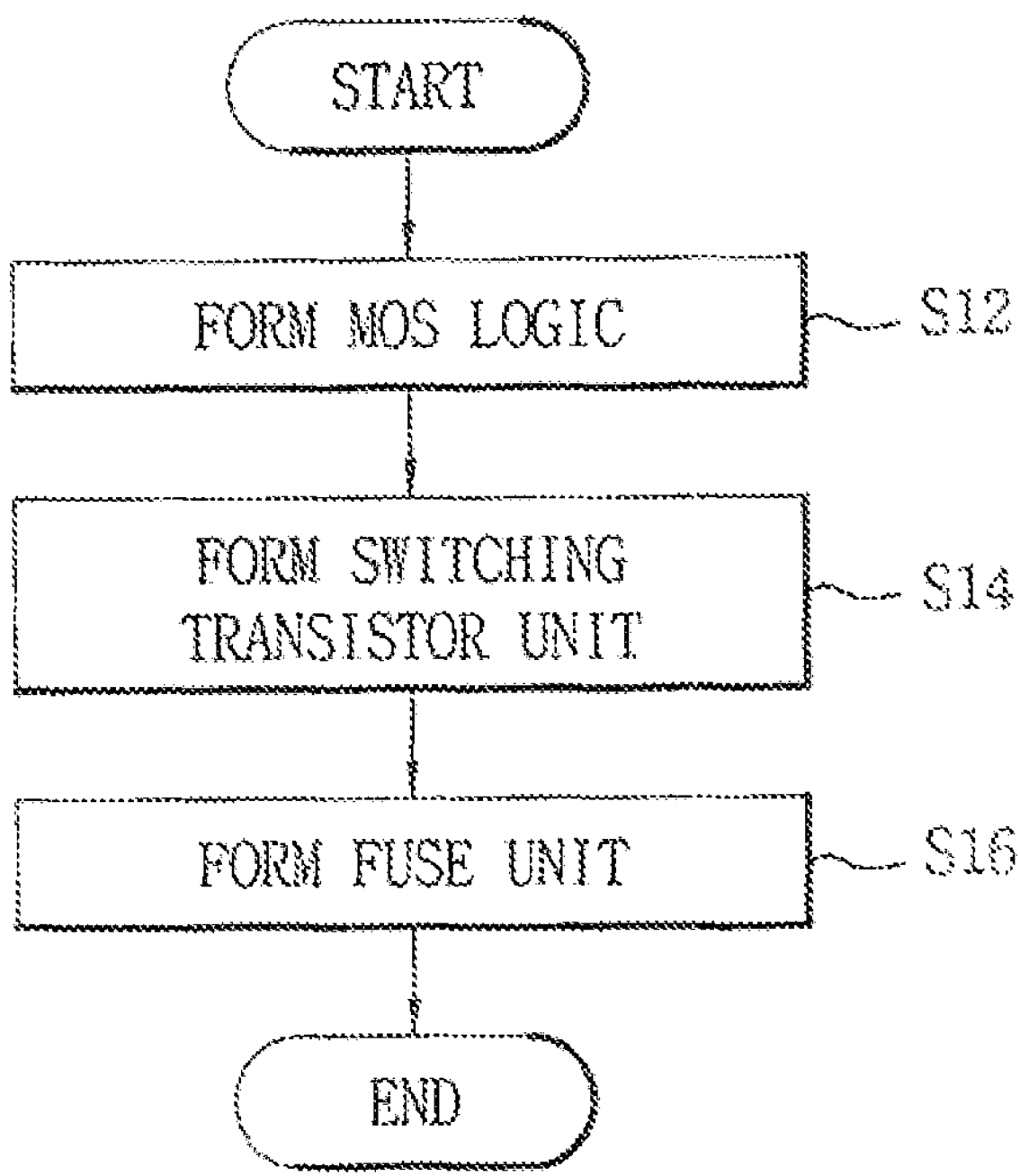
FIG. 7 is a flowchart illustrating a method of fabricating a semiconductor integrated circuit capable of performing a revision by considering performance and a leakage current according to an exemplary embodiment of the present invention.

FIG. 7 is a flowchart illustrating an example of a method of fabricating a semiconductor integrated circuit capable of appropriately performing a revision by considering performance and leakage current according to an exemplary embodiment of the present invention.

With reference to FIG. 7, a method of fabricating the semiconductor integrated circuit includes, a step (S12) of forming a MOS logic; a step (S14) of forming a switching transistor unit to control a supply of first voltage required for operation of the MOS logic; and a step (S16) of forming a fuse unit disposed between the switching transistor unit and a supply terminal of the first voltage on the switching transistor unit, the fuse unit being provided for cutting off a supply of the first voltage to the switching transistor unit by a selective cut.

The first voltage may be power source voltage VDD or ground voltage VSS, like in the semiconductor integrated circuit described above with reference to FIGS. 4 to 6.

The fuse unit may be an electric fuse fused by an overcurrent. Thus, in this exemplary embodiment, the fuse unit may be a portion of an uppermost metal layer of the semiconductor integrated circuit, but it need not be a portion of the uppermost metal layer of the semiconductor integrated circuit.

In the fuse cut through use of a laser beam, the fuse unit may desirably be a portion of an uppermost layer of the semiconductor integrated circuit.

Figure 8:
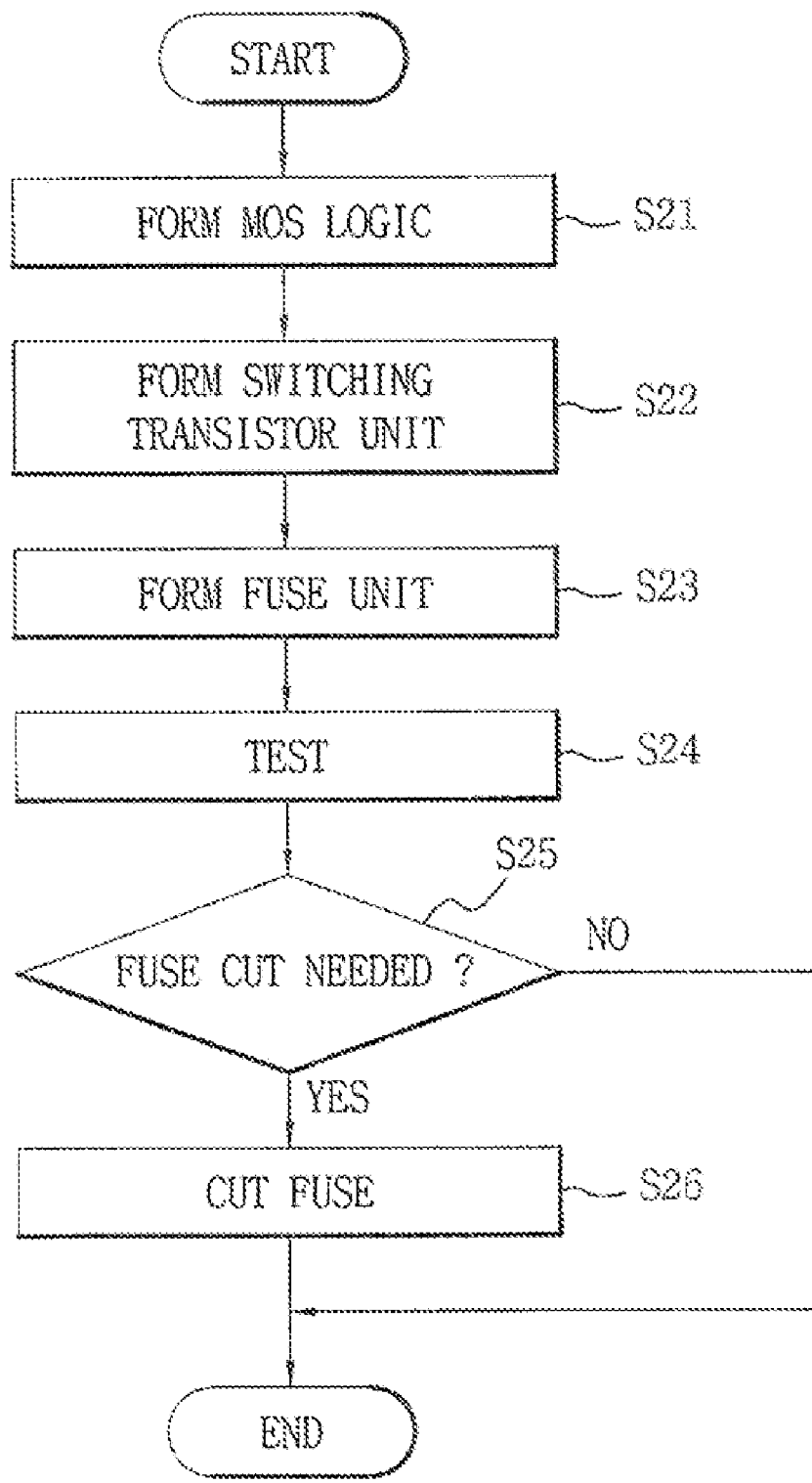
FIG. 8 is a flowchart illustrating a method of fabricating a semiconductor integrated circuit capable of performing a revision by considering performance and a leakage current according to an exemplary embodiment of the present invention.

FIG. 8 is a flowchart illustrating a method of fabricating a semiconductor integrated circuit capable of appropriately performing a circuit revision by considering performance and leakage current according to an exemplary embodiment of the present invention.

Referring to FIG. 8, a method of fabricating the semiconductor integrated circuit includes a step (S21) of forming a MOS logic; a step (S22) of forming a switching transistor unit to control a supply of power source voltage or ground voltage required for operation of the MOS logic; a step (S23) of forming a fuse unit disposed between the switching transistor unit and a supply terminal of the power source voltage or the ground voltage on the switching transistor unit; and a step (S26) of cutting a fuse included in the fuse unit according to a test result.

The method of fabricating the semiconductor integrated circuit may desirably further include a step (S24) of testing the semiconductor integrated circuit and a step (S25) of deciding whether a fuse cut is required after the test, between the steps of (S23) forming the fuse unit and (S26) cutting the fuse.

In the step (S25) of deciding whether the fuse cut is required after the test, it may be further decided how many fuses should be cut.

Furthermore, the cutting of the fuse may be to produce a mask of the fuse based on the test result and to cut the fuse by using the mask.

As described above, in an improved semiconductor integrated circuit and a method of fabricating the same according to exemplary embodiments of the present invention, the problem of an error that may occur in estimating a size, number and structure of the NMOS transistors or the PMOS transistors in a semiconductor integrated circuit having a power gate of MTCMOS may be solved.

Further, in a product development, a production impossibility or a yield decrease based on a performance drop or leakage current increase in the semiconductor integrated circuit having a power gate or MTCMOS may be improved. In performing a circuit revision when an error in estimating the size, number and structure of the NMOS transistors or the PMOS transistors is generated, a difficulty of a delayed product development caused by a mask revision required at a transistor level, may be approved.

In addition, an operating environment may become appropriate to a semiconductor integrated circuit by considering a leakage current and performance in a stop mode.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. Accordingly, these and other changes and modifications are seen to be within the true spirit and scope of the invention as defined by the appended claims.

In the drawings and specification, there have been disclosed exemplary embodiments of the present invention and, although specific terms are employed, they are used in a generic and descriptive sense only and not for purposes of limitation, the scope of the invention being set forth in the following claims.

What is claimed is:

1. A semiconductor integrated circuit for use in performing a revision of an integrated circuit mask, comprising:
    an MOS logic including a plurality of MOS transistors operating by a first voltage and a second voltage;
    a first switching transistor unit disposed between a supply terminal of the first voltage and the MOS logic, and being operable to be turned off to disconnect an electrical connection between the supply terminal of the first voltage and the MOS logic;
    a second switching transistor unit disposed between a supply terminal of the second voltage and the MOS logic, and being operable to be turned off to disconnect an electrical connection between the supply terminal of the second voltage and the MOS logic;
    a first fuse unit disposed between the supply terminal of the first voltage and the first switching transistor unit, including first fuses for cuffing off a supply of the first voltage to the first switching transistor unit by a selective cut based on a test result including a current drive capability of the first switching transistor unit; and
    a second fuse unit disposed between the supply terminal of the second voltage and the second switching transistor unit, including second fuses for cuffing off a supply of the second voltage to the second switching transistor unit by a selective cut based on a test result including a current drive capability of the second switching transistor unit,
    wherein the first and second fuses are cut to perform the revision.

2. The circuit of claim 1, wherein the first voltage is a power source voltage, and the second voltage is a ground voltage.

3. The circuit of claim 2, wherein at least one transistor of the first switching transistor unit is a PMOS transistor.

4. The circuit of claim 3, wherein at least one transistor of the second switching transistor unit is an NMOS transistor.

5. The circuit of claim 1, wherein the first fuse unit and the second fuse unit comprise a portion of an uppermost metal layer of the semiconductor integrated circuit.

* * * * *